(12) United States Patent
Marbella et al.

(10) Patent No.: US 9,387,613 B2
(45) Date of Patent: Jul. 12, 2016

(54) SEMICONDUCTOR FORMATION ARRANGEMENT

(71) Applicant: Infineon Technologies AG, Neubiberg (DE)

(72) Inventors: Carlo Baterna Marbella, Singapore (SG); Ching Yun Tye, Singapore (SG); Ramasubramanian Natarajan, Singapore (SG)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/286,282

(22) Filed: May 23, 2014

(65) Prior Publication Data

US 2015/0336314 A1 Nov. 26, 2015

(51) Int. Cl.
*H01L 23/495* (2006.01)
*B29C 45/27* (2006.01)
*H01L 23/31* (2006.01)
*H01L 21/56* (2006.01)
*B29L 31/34* (2006.01)

(52) U.S. Cl.
CPC .......... *B29C 45/2703* (2013.01); *H01L 21/565* (2013.01); *H01L 23/3107* (2013.01); *H01L 23/495* (2013.01); *B29L 2031/3406* (2013.01)

(58) Field of Classification Search
CPC .. H01L 23/495; H01L 21/56; H01L 23/49573

USPC .......................................... 257/666; 438/127
See application file for complete search history.

(56) References Cited

U.S. PATENT DOCUMENTS

| | | | | |
|---|---|---|---|---|
| 5,049,977 A | * | 9/1991 | Sako | H01L 21/565 174/536 |
| 5,077,237 A | * | 12/1991 | Hara | B29C 45/14655 249/95 |
| 5,825,623 A | * | 10/1998 | Lee | B29C 45/34 257/667 |
| 2012/0021568 A1 | * | 1/2012 | Mino | H01L 21/565 438/127 |
| 2014/0159174 A1 | * | 6/2014 | Matsumoto | G01F 1/692 257/415 |

* cited by examiner

*Primary Examiner* — Phuc Dang
(74) *Attorney, Agent, or Firm* — Murphy, Bilak & Homiller, PLLC

(57) ABSTRACT

A semiconductor package formation arrangement includes a mold housing with an interior cavity having top, bottom and first and second end sides. A gate for transferring liquefied molding material extends to the first end side. A lead frame having a top surface, a rear surface opposite the top surface and a mold flow modifier forms a first cavity section between the top surface and the top side and a second cavity section between the rear surface and the bottom side. A topology of the lead frame causes liquefied molding material to fill the first and second cavity sections at different rates. The mold flow modifier extends away from the lead frame so as to compensate for the difference between the first and second rates.

10 Claims, 14 Drawing Sheets

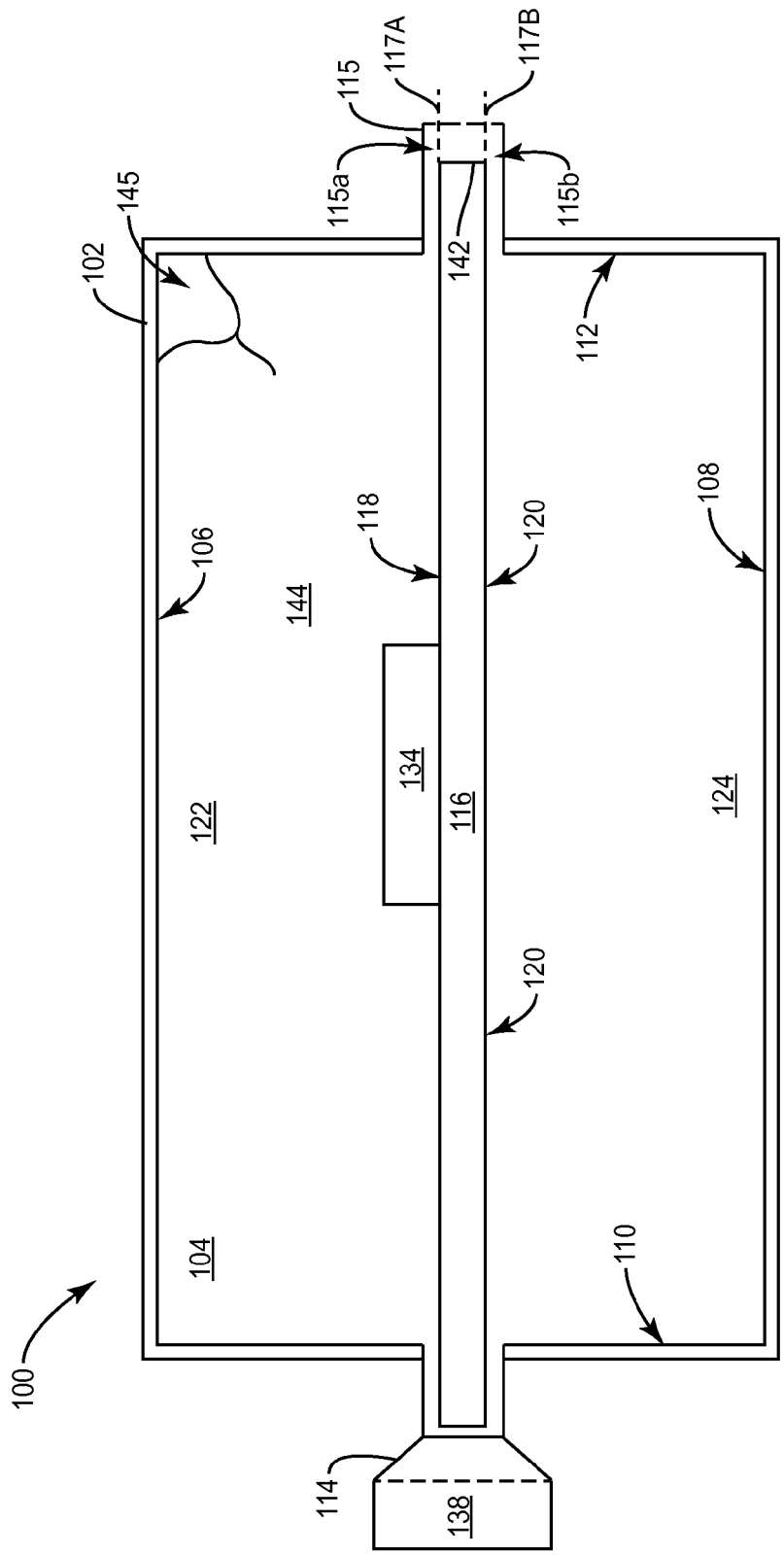

SEMICONDUCTOR FORMATION ARRANGEMENT

TECHNICAL FIELD

The present invention generally relates to device packaging, and more particularly relates to devices and methods for compensating for a difference in flow rates of liquefied resin material within various sections of a mold cavity.

BACKGROUND

Integrated circuit devices, such as semiconductor chips, are commonly packaged with a lead frame and an encapsulant structure. In this packaging arrangement, one or more semiconductor chips are mounted to the lead frame and electrically connected to the lead frame. The encapsulant structure covers the lead frame, semiconductor chip and electrical connections. The lead frame includes external electrical terminals that allow the semiconductor chip to be electrically connected to a printed circuit board, for example. Thus, the packaging arrangement provides an electrical connection between the semiconductor chips and other devices while simultaneously protecting the semiconductor chip and electrical connections from damaging environmental conditions, such as moisture, temperature, foreign particles, etc.

Encapsulant structures for semiconductor packages may be formed by different processes. For instance, the encapsulant structure may be formed by a transfer molding process. In a transfer molding process, the encapsulant structure is formed by a liquefied encapsulant material, such as a thermoset resin or an epoxy. According to this procedure, the liquefied encapsulant material is molded in a cavity that surrounds the device and lead frame. The liquefied encapsulant material is then hardened into a solid state and the cavity structure is removed.

One difficulty associated with forming a packaging arrangement using the above described process involves accounting for the flow rate of liquefied molding material. Ideally, the process should be able to uniformly fill different sections of the cavity so that liquefied encapsulant material reaches the end of the cavity sections and ejects trapped air or gas through vents in the cavity. However, this can be difficult or impossible if the liquefied encapsulant material moves at different rates within different sections of the cavity due to non-uniform geometric structures. If the liquefied encapsulant material fills one cavity section before another, flow fronts may merge away from the vents, which may entrap air or gas and cause voiding. Furthermore, unbalanced flow rates of liquefied encapsulant material may result in defective or incomplete encapsulation structures. As a result, the packaging arrangement is less effective or ineffective at protecting the semiconductor chip and electrical connections from damaging environmental conditions, may be more susceptible to delamination, and may have to be discarded.

SUMMARY

According to one embodiment, a semiconductor package formation arrangement is disclosed. The arrangement includes a mold housing having an interior cavity. The cavity has a top side spaced apart from a bottom side and first and second end sides extending between the top and bottom sides. The mold housing further includes a gate for transferring liquefied molding material into the cavity. The gate is arranged in the mold housing and extends to the first end side of the cavity. The semiconductor package formation arrangement further includes a lead frame having a top surface, a rear surface opposite the top surface and a mold flow modifier. The lead frame is positioned in the interior cavity so as to form a first cavity section between the top surface and the top side and a second cavity section between the rear surface and the bottom side. A topology of the lead frame is such that that the liquefied molding material fills the first cavity section at a first rate and fills the second cavity section at a second rate that is different than the first rate. The mold flow modifier extends away from the lead frame so as to compensate for the difference between the first and second rates.

According to another embodiment, a semiconductor device assembly is disclosed. The semiconductor device assembly includes a lead frame having a top surface and a rear surface opposite the top surface. A semiconductor chip is mounted on the top surface and electrical conductors are arranged between conductive terminals of the semiconductor chip and the top surface. A solidified molding material adjoins the lead frame and semiconductor chip so as to encapsulate the semiconductor chip and electrical conductors. A mold flow modifier extends away from the rear surface of the lead frame. The mold flow modifier is configured to compensate for a difference between a first rate of liquefied molding material flowing across the top surface and a second rate of liquefied molding material flowing across the rear surface.

According to another embodiment, a method of packaging a semiconductor chip is disclosed. The method includes arranging a lead frame in an interior cavity of a mold housing. The lead frame includes a top surface, a rear surface opposite the top surface and a mold flow modifier. The interior cavity includes a top side spaced apart from a bottom side and first and second end sides extending between the top and bottom sides. The lead frame is arranged to form a first cavity section between the top surface and the top side and a second cavity section between the rear surface and the bottom side. The method further includes transferring liquefied molding material in a gate in the mold housing. The gate extends to the first end side of the cavity. A topology of the lead frame is such that liquefied molding material fills the first cavity section at a first rate and fills the second cavity section at a second rate that is different than the first rate. The method further includes compensating for the difference between the first and second rates by using the mold flow modifier to redirect the flow of liquefied molding material across the top surface or the rear surface.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 2A-2C depicts liquefied molding material flowing into the first and second cavity sections and the topology of the lead frame causing liquefied molding material to fill the first and second cavity sections at different rates, according to an embodiment.

FIGS. 3A-3B depicts liquefied molding material flowing into the interior cavity of a semiconductor packaging arrangement having a mold flow modifier, according to an embodiment.

FIGS. 4A-4C depicts a mold flow modifier configured as an inclined chute that redirects liquefied molding material between the first and second cavity sections, according to an embodiment.

FIGS. 5A-5C depicts a mold flow modifier configured as an inclined chute that redirects liquefied molding material between the first and second cavity sections, according to another embodiment.

FIGS. 6A-6B depicts a mold flow modifier that is a solid hump configured to retard liquefied molding material flowing across a surface of the lead frame, according to an embodiment.

FIGS. 7A-7C depicts a mold flow modifier that is a solid hump configured to retard liquefied molding material flowing across a surface of the lead frame, according to another embodiment.

FIGS. 8A-8C depicts a mold flow modifier that has a planar surface arranged at an outer end of the lead frame and extends away from the lead frame at an incline so as to retard the flow of liquefied molding material in one cavity section and delay the entry of liquefied molding material into another cavity section, according to an embodiment.

FIG. 9 including

DETAILED DESCRIPTION

Embodiments described herein provide a mold flow modifier extending away from a lead frame that is configured to compensate for a difference in flow rates of liquefied molding material. This difference in flow rates may be attributable to semiconductor chips, conductors, and other protrusions extending away from the surfaces of a lead frame. The mold flow modifier compensates for the difference between the first rate and second rate by retarding the flow of liquefied molding material so as to counteract the collective influence of the protrusions extending away from the surfaces of the lead frame. According to some embodiments, the mold flow modifier redirects liquefied molding material between sections of a mold housing so as to increase the rate at which one cavity section is filled by liquefied molding material while simultaneously reducing the rate at which another section is filled by liquefied molding material. According to other embodiments, the mold flow modifier acts as a speed bump so as to reduce the rate at which one section is filled by liquefied molding material.

The arrangements and methods described herein provide numerous advantages. For instance, because the difference in flow rates of liquefied molding material is reduced or eliminated, the molding cavity can be filled evenly and uniformly. As a result, the propensity for liquefied molding material to overfill one section and interfere with the filling of another section is reduced. Consequently, the likelihood of void formation in the molding material is reduced, and the potential size of voids that may form in the molding material is reduced. Additionally, the mold flow modifier acts as a locking mechanism between the lead frame and the encapsulant material. Consequently, the likelihood of delamination between the lead frame and the encapsulant material is reduced. The mold flow modifier can be formed on a lead frame by a well-known and inexpensive manufacturing step, such as stamping or coining. Accordingly, the disclosed packaging techniques are simpler and more cost-effective than other solutions utilized to address differences in mold flow rate, such as die pad downset angling.

Figure 1:
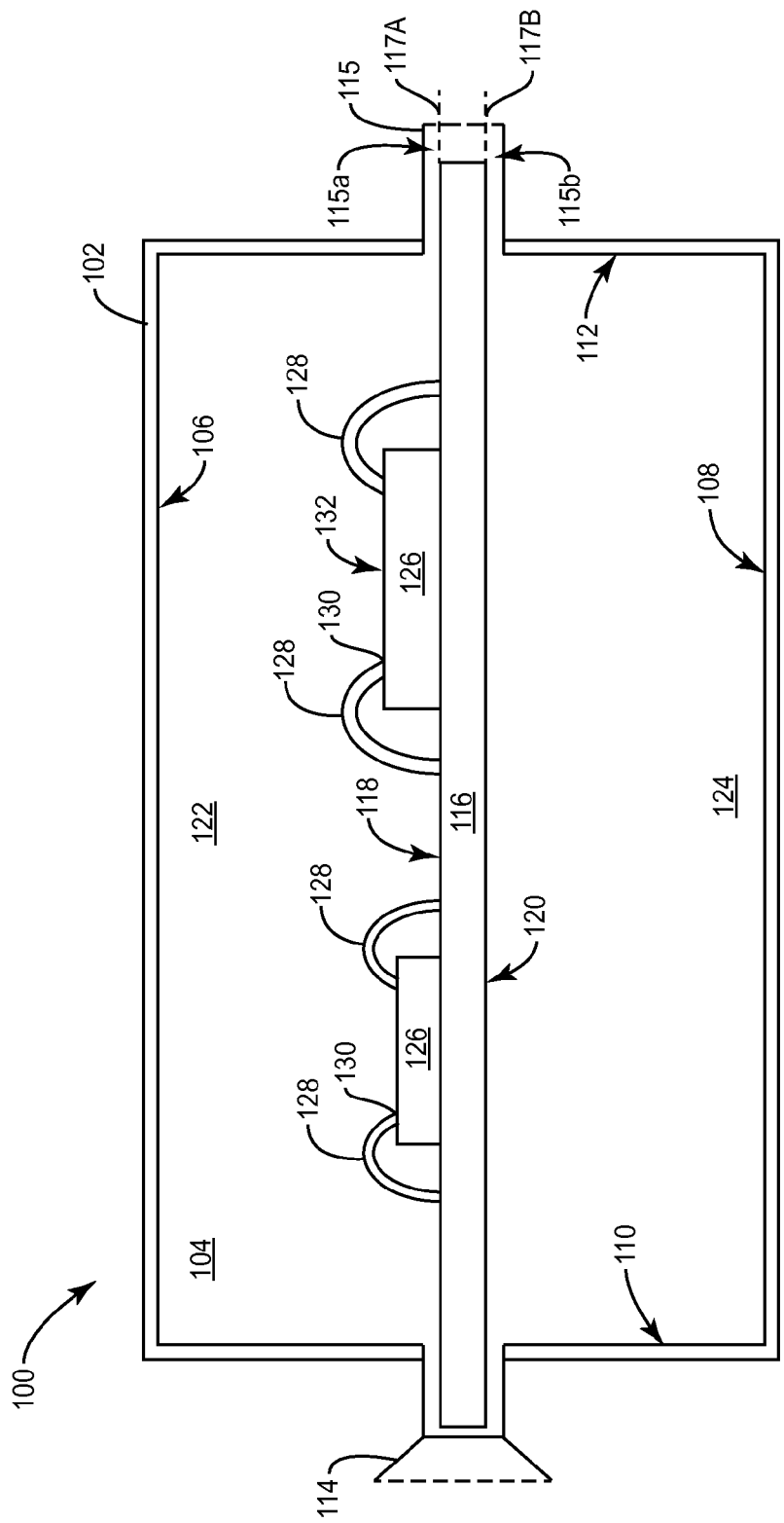
FIG. 1 depicts a semiconductor package formation arrangement having a lead frame dividing the interior cavity of a mold housing into first and second cavity sections, according to an embodiment.

FIG. 1 depicts a semiconductor package formation arrangement 100, according to an embodiment. The arrangement 100 includes a mold housing 102 for forming an encapsulation structure. The mold housing 102 includes an interior cavity 104 that is shaped complimentary to the shape of the desired encapsulation structure. The interior cavity 104 includes a top side 106 spaced apart from a bottom side 108. The interior cavity 104 further includes a first end side 110 and a second end side 112. The first and second end sides 110, 112 extend between the top and bottom sides 106, 108, either completely or partially. The top, bottom and end sides 106, 108, 110, 112 may be substantially planar. That is, the interior cavity 104 may be cube shaped. Alternatively, the interior cavity 104 may be any one of a variety of three-dimensional shapes commonly used to encapsulate a semiconductor device and a lead frame. The mold housing 102 includes a gate 114 for transferring or injecting liquefied molding material into the cavity 104. The gate 114 extends through the mold housing 102 and extends to the first end side 110 of the cavity 104. The gate 114 is dimensioned to receive a molding tool, such as a secondary runner of a transfer mold tool.

A lead frame 116 is arranged in the interior cavity 104. The lead frame 116 includes a top surface 118 and a rear surface 120 opposite the top surface 118. The top surface 118 may be electrically connected to semiconductor devices, such as transistors, processors, diodes, for example. The bottom surface 120 may be downset and physically attached to an external apparatus, such as a PCB (printed circuit board) with solder. The lead frame 116 may be any lead frame or substrate commonly utilized for the mounting and packaging of a semiconductor chip. The lead frame 116 is positioned so as to form a first cavity section 122 and a second cavity section 124 within the interior cavity 104. That is, the lead frame 116 is arranged so that the interior cavity 104 is divided into first and second cavity sections 122, 124.

The first and second cavity sections 122, 124 are on opposite surfaces 118, 120 of the lead frame 116. The first cavity section 122 extends between the top surface 118 and the top side 106 of the interior cavity 104. The second cavity section 124 extends between the rear surface 120 and the bottom side 108 of the interior cavity 104. According to an embodiment, the lead frame 116 is placed approximately in the center of the interior cavity 104 so that the first cavity section 122 has substantially identical dimensions as the second section 124 (e.g. a distance between the top and bottom sides 106, 108 is similar or identical to a distance between the top and bottom surfaces 118, 120 of the lead frame 116).

The lead frame 116 may be arranged substantially parallel to the top and bottom sides 106, 108 of the interior cavity 104. That is, the top surface 118 may be substantially parallel to the top side 106 and the rear surface 120 may be substantially parallel to the bottom side 108. Alternatively, the top surface 118 and the rear surface 120 may be arranged at an incline with respect to the top and bottom sides 106, 108. The lead frame 116 may be configured so that external electrical terminals (not shown) exit the mold housing 102.

A vent 115 is arranged on an opposite side of the mold housing 102 as the gate 114. The lead frame 116 is arranged in the vent 115 so as to form a first vent 115a exiting the first cavity section 122 and a second vent 115b exiting the second cavity section 124. The first and second vents 115a, 115b may provide an opening having a clearance of approximately 30 microns between the top and bottom sides 118, 120 of the lead frame 116 and the mold housing 102, for example. The first and second vents 115a, 115b may be arranged along parting lines 117a, 117b. The parting lines 117a, 117b are perpendicular to the first and second end sides 110 and extend out of the vent 115. Optionally, the lead frame 116 may be arranged in a die-pad downset position such that the top and bottom sides 118, 120 are inclined with respect to the parting lines 117a, 117b. The first and second vents 115a, 115b allow fluid, such as air or other gasses, to escape from the mold housing 102 during the package molding process.

Liquefied molding material entering the interior cavity 104 fills both the first cavity section 122 and the second cavity section 124. The gate 114 and vent 115 are arranged along the parting lines 117a, 117b between the first and second cavity sections 122, 124. Ideally, liquefied molding material flowing through both the first cavity section 122 and the second cavity section 124 should meet at the parting lines 117a, 117b when the interior cavity 104 is completely filled. This allows air and gas to escape from the interior cavity 104 in a uniform manner and reduces the likelihood of voiding. However, as will be explained in further detail below, the geometry of the features within the interior cavity 104 may prevent the liquefied molding material flowing through each of the cavity sections 122, 124 from meeting at the parting lines 117a, 117b, which increases the possibility of voiding.

One or more semiconductor chips 126 may be mounted and/or electrically connected to the top surface 118. The semiconductor chips 126 may be mounted using any commonly known technique, such as solder, adhesive tape, epoxy, etc. Electrical conductors 128 are arranged between conductive terminals 130 of the semiconductor chips 126 and the top surface 118 so as to electrically connect the semiconductor chips 126 to the lead frame 116. The electrical conductors 128 may be wires or ribbons extending between a top side 132 of the semiconductor chips 126 and the top surface 118. Alternatively, the semiconductor chips 126 may be configured as flip-chips (not shown) in which the conductive terminals 130 are arranged on a bottom side of the semiconductor chip 126 such that the conductive terminals 130 directly face and electrically connect to the top surface 118. As shown in FIG. 1, two semiconductor chips 126 of different size are mounted to top surface 118. Further, the semiconductor chips 126 are mounted by electrical conductors 128 of different thickness. According to an embodiment, the electrical conductors 128 depicted on the left side of FIG. 1 are thinner gold or aluminum wires, and may be approximately 25-50 microns thick. The electrical conductors 128 depicted on the right side of FIG. 1 may be thicker aluminum wires, and may be approximately 300-350 microns thick. The size, number and configuration of semiconductor chips 126 and electrical conductors 128 may vary, depending upon application requirements.

Figure 2:
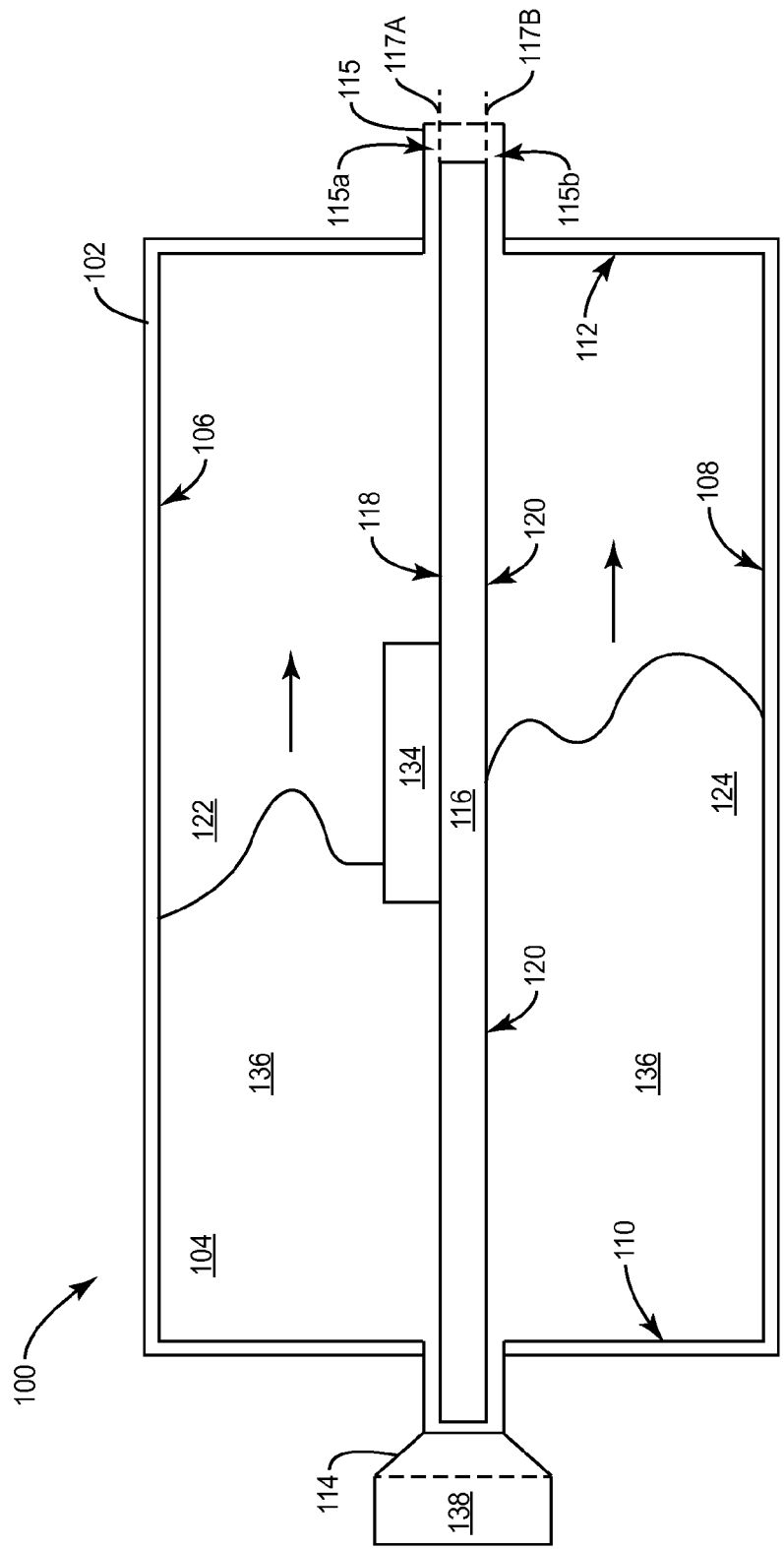
FIG. 2 including
Figure 2:
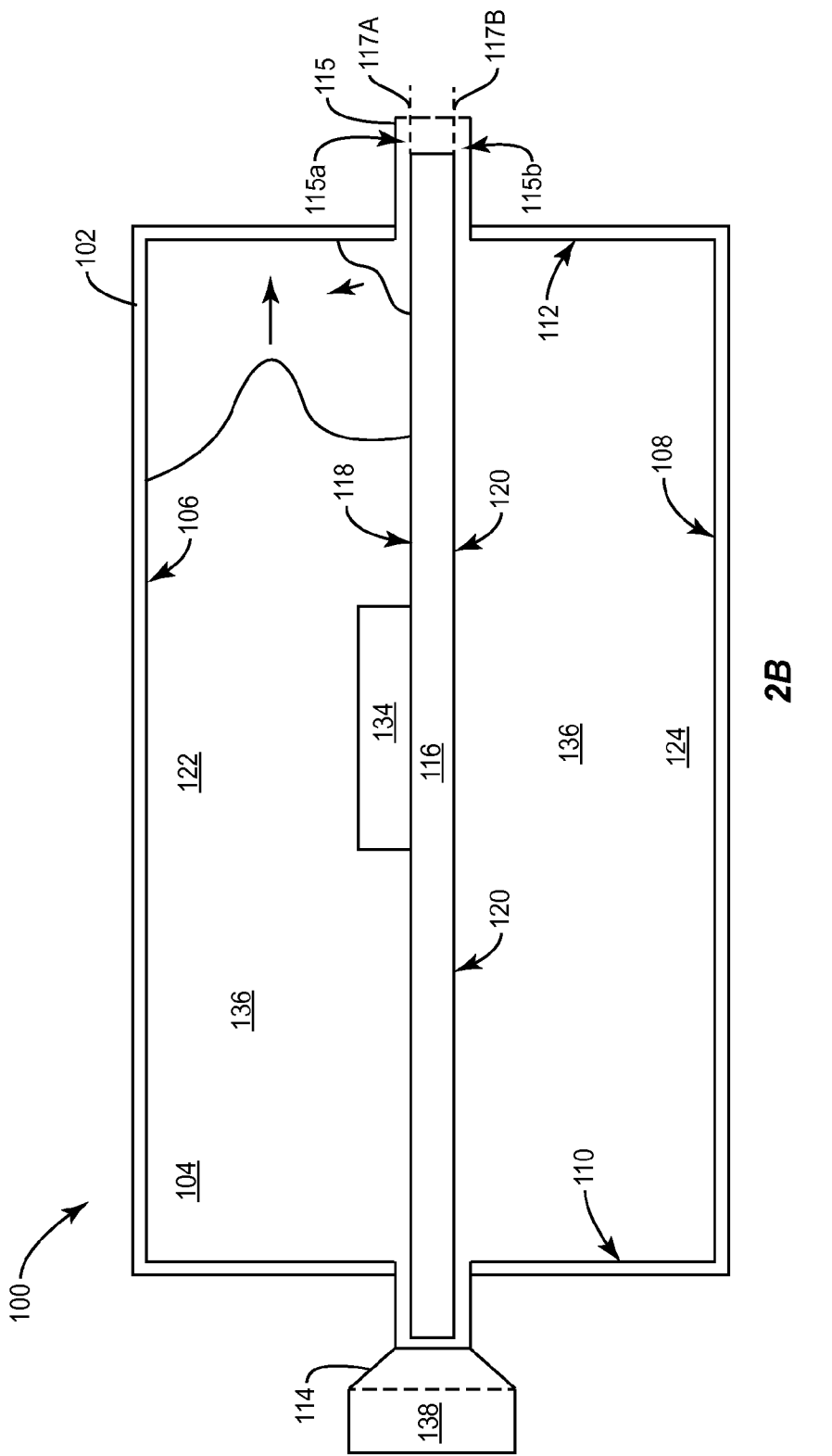

FIG. 2 depicts the influence of a topology 134 of the lead frame 116 on the flow of liquefied molding material 136 into the interior cavity 104 of the mold housing 102. The liquefied molding material 136 may be a thermoset resin, resin, or a thermoplastic, or any other liquid material used to form a package structure, for example. The topology 134 depicted in FIG. 2 is a representation of all of the items extending away from the surfaces 118, 120 of the lead frame 116 that contribute to a difference in the flow of liquefied molding material between the first and second cavity sections 122, 124. The topology 134 may include the semiconductor chips 126 and electrical conductors 128 depicted in FIG. 1, for example. The topology 134 may also include other items on the lead frame, such as metal leads, conductors, bonding pads, etc. The topology 134 may significantly retard the flow of liquefied molding material across the top surface 118. In contrast, the rear surface 120 of the lead frame 116 may be substantially planar such that liquefied molding material flows across the rear surface 120 without substantial resistance.

FIG. 2A depicts liquefied molding material 136 flowing into the interior cavity 104 through the gate 114 by a molding tool 138. Due to the topology 134 of the lead frame 116, the liquefied molding material 136 enters the second cavity section 124 at a higher rate than the first cavity section 122. That is, the topology 134, which includes the semiconductor chips 126 and electrical conductors 128, causes liquefied molding material 136 to travel across the top surface 118 at a slower rate than across the rear surface 120.

As shown in FIG. 2B, the difference in mold flow rates causes the second cavity section to 124 to be filled with liquefied molding material 136 before the first cavity section 122 is filled with liquefied molding material 136. As a result, the liquefied molding material 136 flowing in each of the first and second cavity sections 122, 124 does not meet at the parting lines 117a, 117b. Consequently, voids may form at the end of the package as the molding tool 138 is unable to completely fill the first section 122 of the mold housing 102. In other words, the fluid dynamics of the liquefied molding material 136 in this scenario results in air gaps above the parting lines 117a, 117b that are not flushed out by the vent 115a. Furthermore, gases generated from chemical reaction of the liquefied molding material may be trapped in the interior cavity 104 and unable to escape through the vent 115.

FIG. 2C depicts a finalized state of the semiconductor packaging arrangement 100 after the liquefied molding material 136 has hardened into an encapsulation structure 144. The finalized semiconductor packaging arrangement 100 may have significant sized voids 145 near the end 142 of the lead frame 116 and near the second end side 112 of the mold housing 102. If these voids 145 are sufficiently large (e.g. 250 microns), the device may have to be discarded because the encapsulation structure 144 is ineffective at protecting the semiconductor chips 126 and corresponding electrical connections, and/or and because the likelihood of delamination is unacceptably high and can be seen by visual inspection on the molded package.

The semiconductor packaging arrangement 100 may be alternatively be configured so that liquefied molding material 136 enters the first cavity section 122 at a higher rate than the second cavity section 124. The rear surface 120 of the lead frame 116 may include further semiconductor chips 126 or other features that cause this difference in flow rate. Further, the lead frame 116 may be angled in a manner that causes this difference in flow rate. In that instance, voids 145 may occur in a similar manner as described above.

Figure 3:
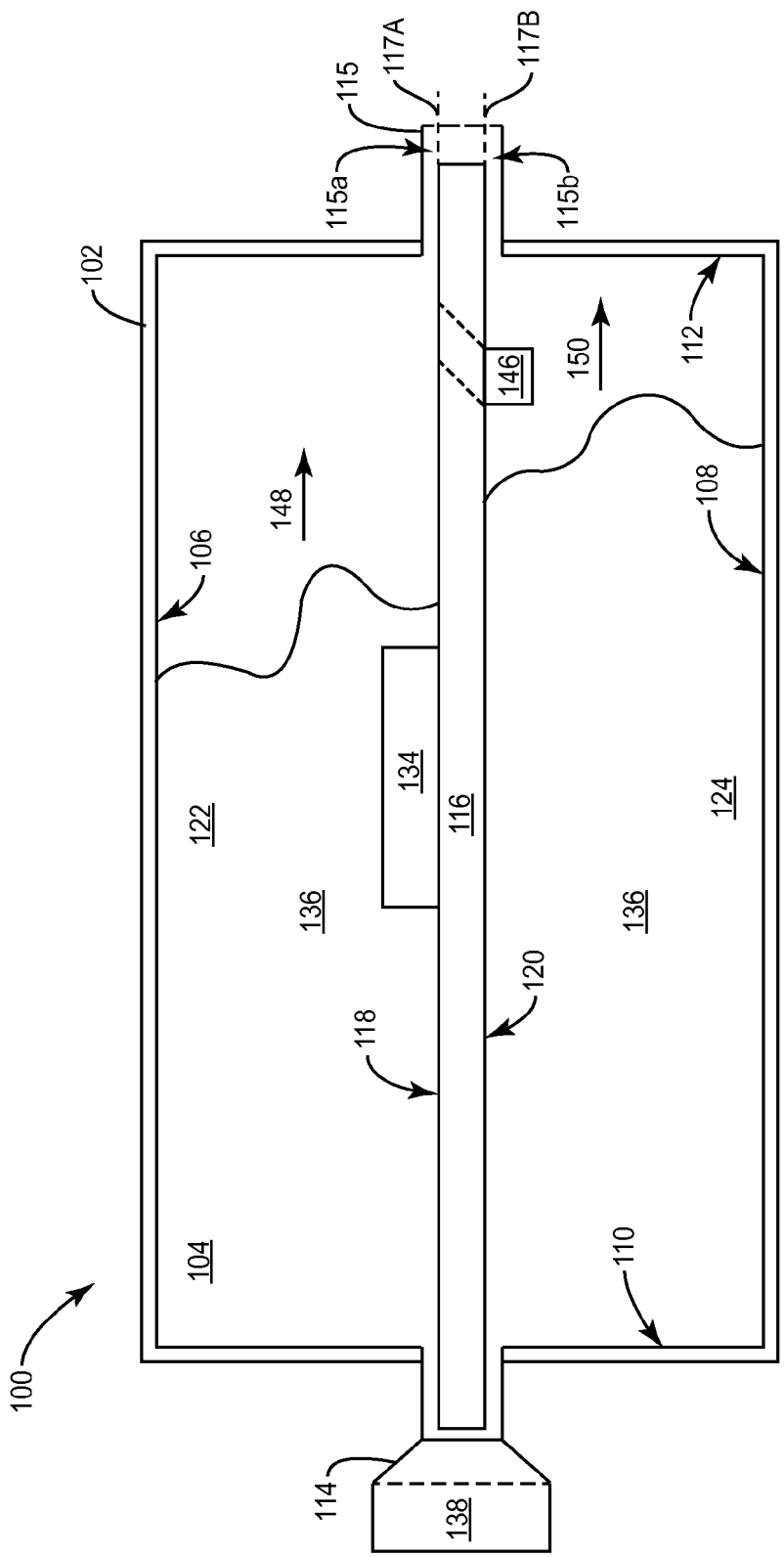
FIG. 3 including
Figure 3:
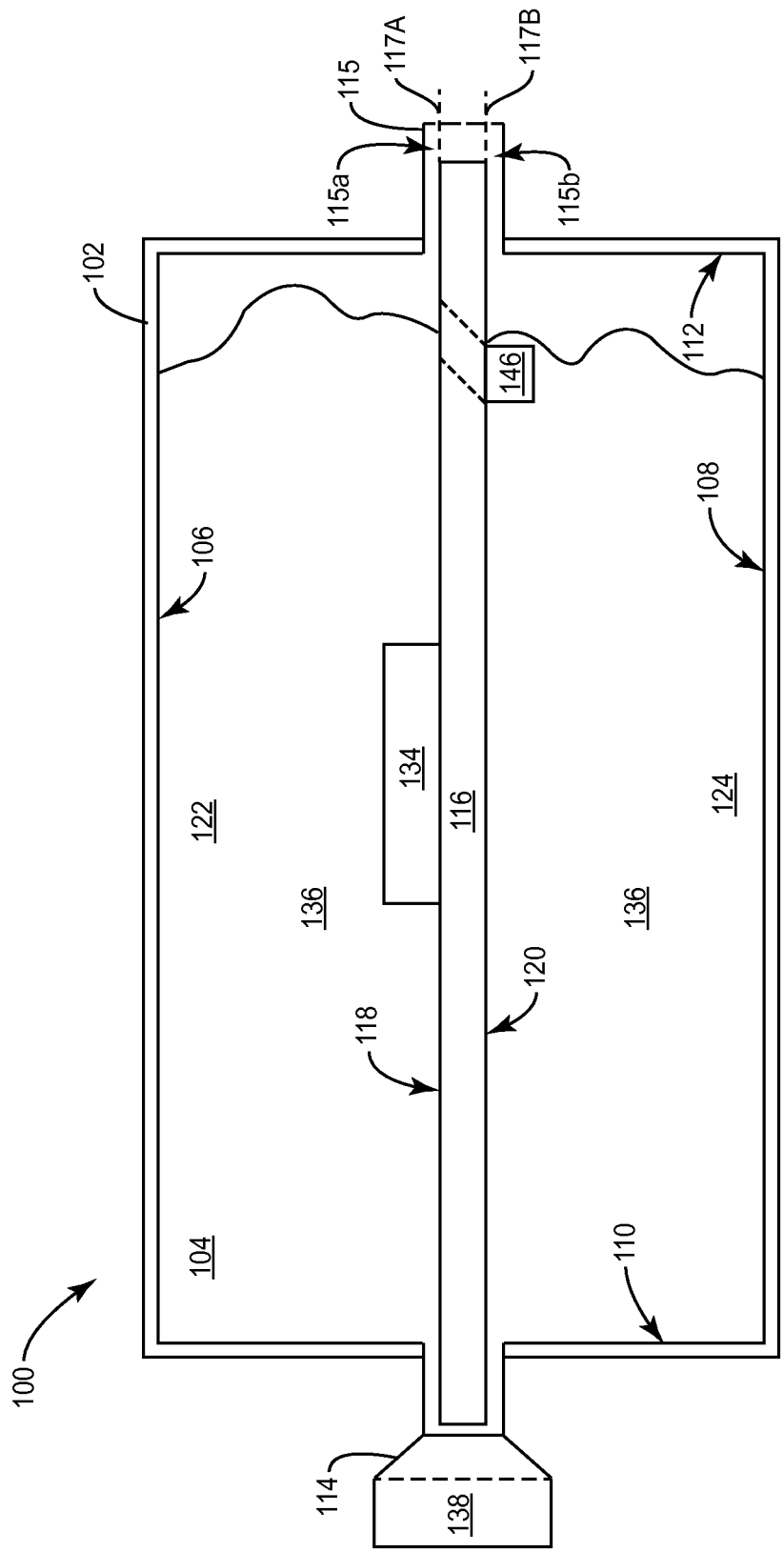

FIG. 3 depicts liquefied molding material 136 flowing into the mold cavity 104 of a semiconductor packaging arrangement 100 having a mold flow modifier 146. The liquefied molding material 136 fills the first cavity section 122 at a first rate 148 and fills the second cavity section 124 at a second rate 150 that is different than the first rate 148. The first and second rates 148, 150 describe the rate at which liquefied molding material 136 enters the first and second cavity sections 122, 124 before reaching the mold flow modifier 146. That is, the first and second rates 148, 150 refer to flow rates of the liquefied molding material 136 that do not account for the influence of the mold flow modifier 146. The difference between the first rate 148 and the second rate 150 may be attributable to the topology of the lead frame, as discussed with reference to FIGS. 2A-2C. In the depicted embodiment, the first rate 148 is less than the second rate 150.

The mold flow modifier 146 is configured to redirect the flow of liquefied molding material 136 within the interior cavity 104. The mold flow modifier 146 extends away from the lead frame 116 so as to compensate for the difference between the first and second rates 148, 150. The mold flow modifier 146 compensates for the difference between the first and second rates 148, 150 by retarding the flow of liquefied molding material 136 across the surface 118, 120 from which the mold flow modifier 146 extends away from. In the illustrated embodiment of FIG. 3A, the mold flow modifier 146 extends away from the rear surface 120 so as to compensate for a first rate 148 that is less than the second rate 150. That is, the mold flow modifier 146 may be arranged on the rear surface 120 such that, after the liquefied molding material 136 reaches the mold flow modifier 146, the retarding effects of the semiconductor chips 126 and electrical conductors 128 on the top surface 118 are counteracted by the retarding and/or channeling effect of the mold flow modifier 146 on the rear surface 120. Alternatively, the mold flow modifier 146 may extend away from the top surface 118 so as to retard or channel the liquefied molding material 136 flowing across the top surface 118, in the event that the second rate 150 that is less than the first rate 148.

The mold flow modifier 146 may be configured to partially or completely compensate for the difference between the first and second rates 148, 150. That is, the mold flow modifier 146 may reduce but not completely eliminate the difference between the first and second rates 148, 150. Optionally, the mold flow modifier 146 may be configured to completely eliminate the difference between the first and second rates 148, 150 such that liquefied molding material 136 fills the first and second cavity sections 122, 124 in approximately the same amount of time.

The mold flow modifier 146 may be arranged anywhere on the lead frame 116 suitable for compensating between differences in mold flow rates as discussed herein. The mold flow modifier 146 may be arranged in any location on the rear surface 120 or in any location on the top surface 118 that does not interfere with the mounting and electrical connection of the semiconductor chips 126.

Referring to FIG. 3B, the mold flow modifier 146 has compensated for the difference between the first and second rates 148, 150 such that both the first cavity section 122 and the second cavity section 124 will be filled at approximately the same time. Accordingly, the liquefied molding material 136 fills into the cavity 104 more evenly and uniformly and therefore meets at the parting lines 117a, 117b. As a result, the voiding scenario depicted in FIG. 2C can be avoided.

Figure 4:
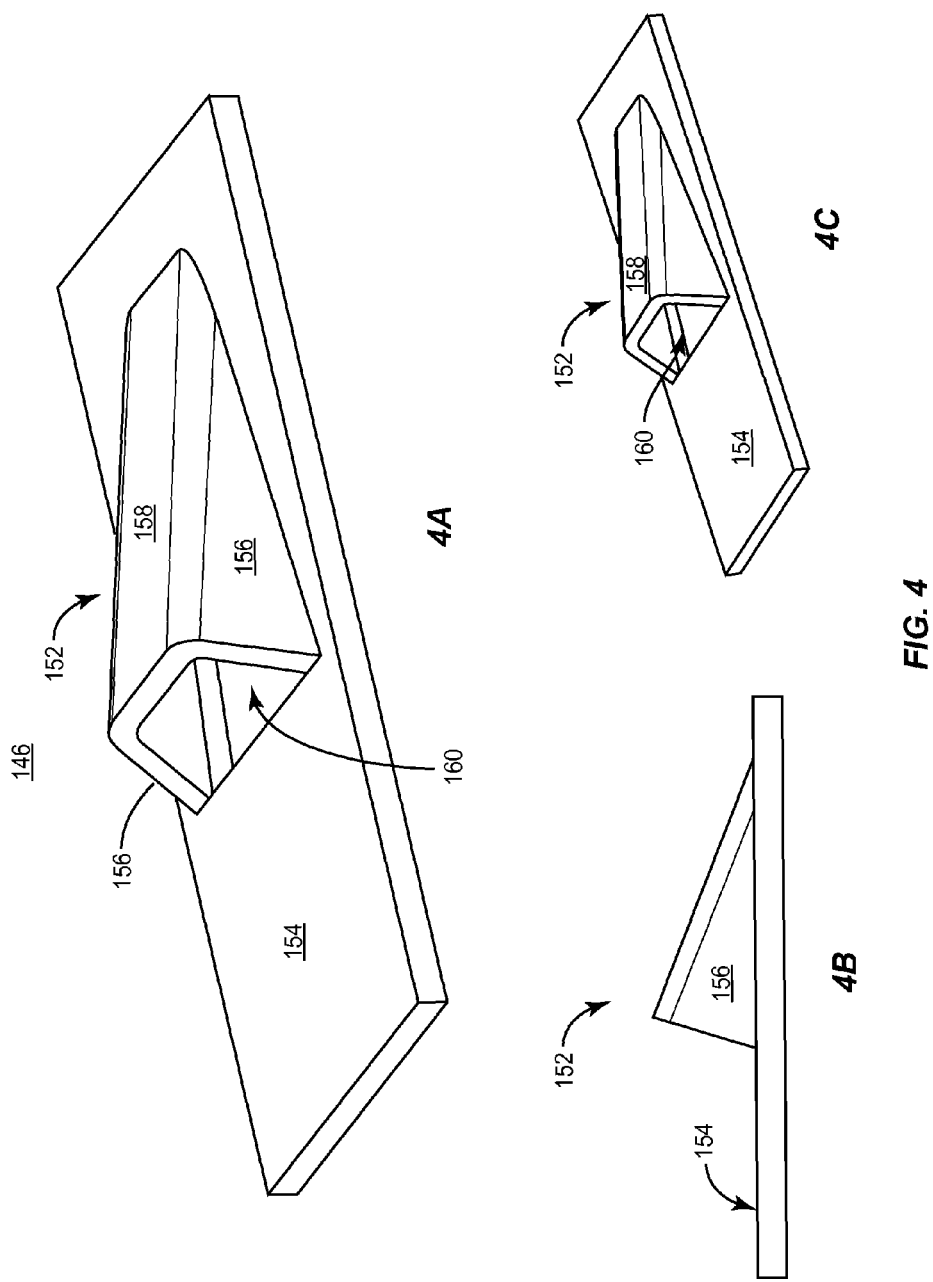
FIG. 4 including

FIGS. 4-8 depict various embodiments of a mold flow modifier 146 that may be used in accordance with the presently disclosed semiconductor package formation arrangement 100. Referring to FIG. 4, the mold flow modifier 146 is configured to compensate for the difference between the first and second rates 148, 150 by redirecting liquefied molding material 136 from the first cavity section 122 to the second cavity section 124 or vice versa. Thus, the mold flow modifier 146 according to this embodiment simultaneously reduces one of the first and second rates 148, 150 while increasing the other of the first and second rates 148, 150. Further, the mold flow modifier 146 according to this embodiment retards the flow of liquefied molding material 136 by extending away from the lead frame 116 and providing a surface that opposes the direction of mold flow.

The mold flow modifier 146 of FIG. 4 is configured as an inclined chute 152. The inclined chute 152 extends away from a surface 154. The surface 154 may be the top surface 118 or the rear surface 120 of the lead frame 116. The inclined chute 152 provides a channel between the first and second cavity sections 122, 124 that redistributes the flow of liquefied molding material 136 from one cavity section to another.

As shown in FIG. 4, the inclined chute 152 includes two sidewall sections 156 spaced apart from one another. The two sidewall sections 156 extend away from the surface 154 and may be at a perpendicular or inclined angle with respect to the surface 154. A roof section 158 extends between the two sidewall sections 156 and adjoins the lead frame 116. The roof section and two sidewall sections are adjacent to an opening 160 in the lead frame 116. The roof section 158 is arranged at an incline with respect to the with respect to the surface 154. Thus, the two sidewall sections 156 and roof section 158 form a three sided structure that extends away from the lead frame 116 in such a way that liquefied molding material 136 is guided through the opening 160. The angle of incline of the roof section 158 with respect to the surface 154 may be adjusted to meet application requirements. An angle of incline of ten degrees may be selected if a relatively small amount of mold flow redistribution is required, for example. An angle of incline of fifty degrees may be selected if a larger degree of mold flow redistribution is required, for example.

Figure 5:
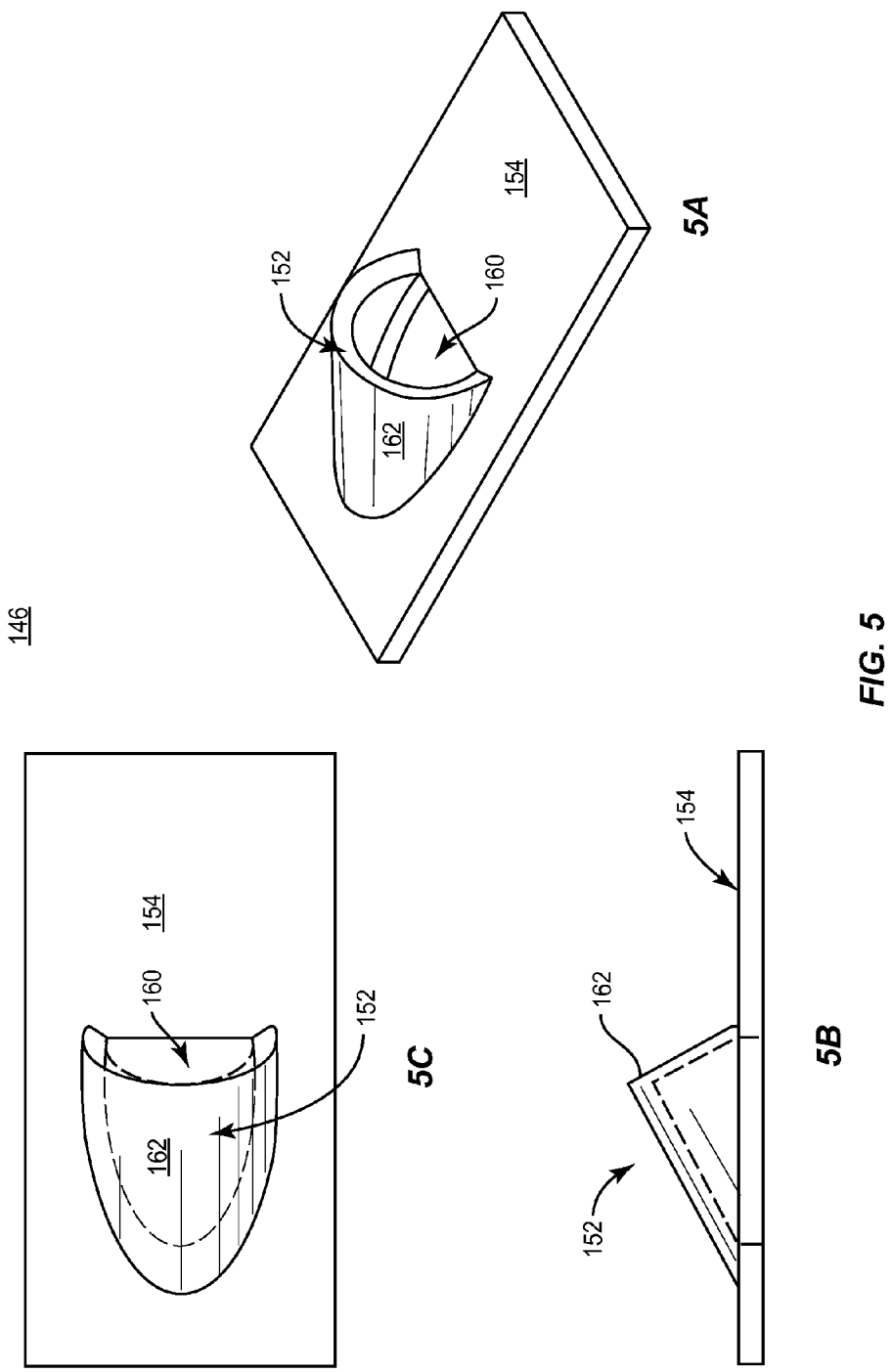
FIG. 5 including

FIG. 5 depicts an alternate embodiment of the mold flow modifier 146 configured as an inclined chute 152. In this embodiment, the inclined chute 152 is formed from a semi-circular portion 162 extending away from the surface 154 and adjoining the opening 160 in the lead frame 116. That is, the semi-circular portion 162 in the embodiment of FIG. 5 is tube-shaped and does not include abrupt angles or planar surfaces. The semi-circular 162 portion of FIG. 5 is arranged at an incline with respect to the surface 154 and redistributes the flow of liquefied molding material 136 in a similar manner as described above with respect to the embodiment of FIG. 4.

Figure 6:
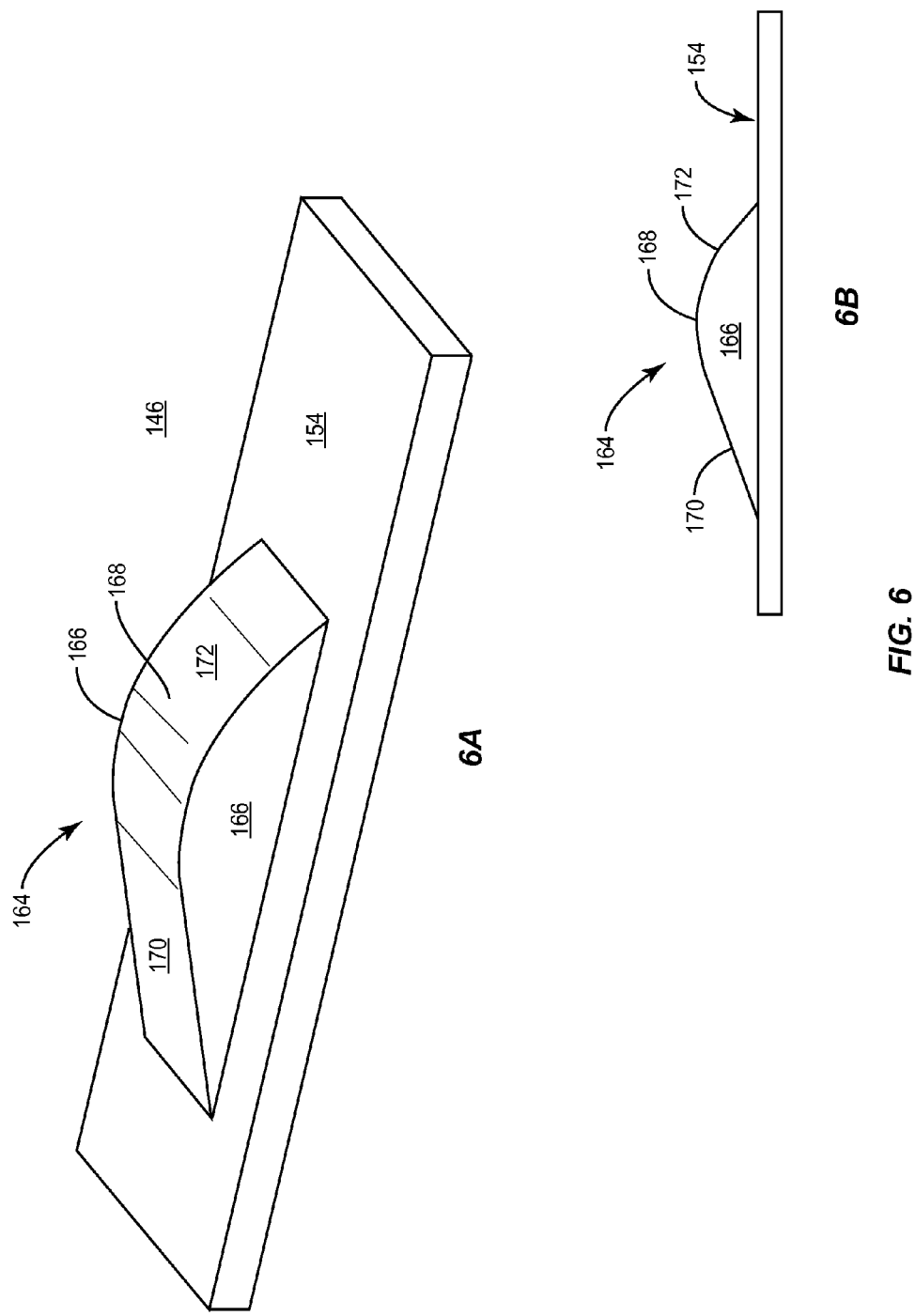
FIG. 6 including

FIG. 6 depicts a mold flow modifier 146 that is configured to retard the flow of liquefied molding material by deflecting liquefied molding material away from surface 154 upon which the mold flow modifier 146 is arranged. The surface 154 may be the top surface 118 or the rear surface 120 of the lead frame 116. The mold flow modifier 146 according to this embodiment introduces an obstruction in the natural flow path of the liquefied molding material 136 across the surface 154 that slows down the rate of mold flow. Consequently, the different flow rates 148, 150 can be compensated for by arranging the mold flow modifier 146 on one of the surfaces 118, 120 to counteract the liquefied molding material 136 that is moving faster.

In the embodiment of FIG. 6, the mold flow modifier 146 is a solid hump 164 that extends away from the surface 154. That is, the mold flow modifier 146 does not include any openings or inlets configured to draw liquefied molding material 136 in a direction towards the lead frame. If the mold flow modifier 146 is arranged on the rear surface 120, the mold flow modifier redirects liquefied molding material flowing across the rear surface 120 towards the bottom side 108 of the cavity 104. The solid hump 164 of FIG. 6 includes two sidewalls 166 extending away from the surface 154. The sidewalls 166 may be at an inclined or perpendicular angle with respect to the surface 154. The solid hump of FIG. 6 further includes an outer surface 168 extending between the two sidewalls 166 and adjoining the lead frame 116. According to an embodiment, the outer surface 168 includes an inclined plane 170 with respect to surface 154 and a curved section 168. The rate of incline of the inclined plane 170 and the curvature of the outer surface 168 of these sections may be adjusted retard the flow of liquefied molding material 136 by a desired amount.

Figure 7:
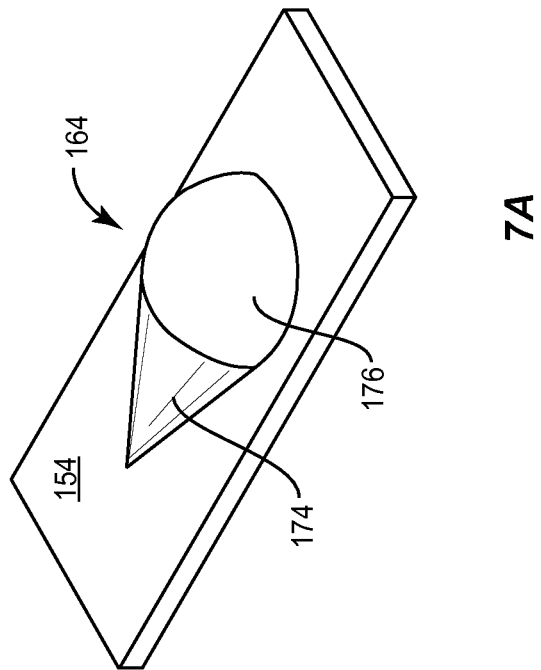
FIG. 7 including
Figure 7:
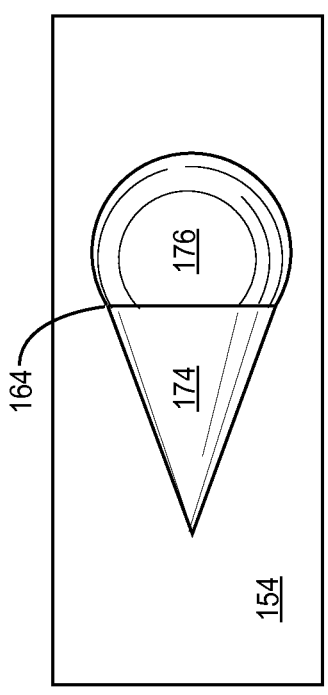
Figure 7:
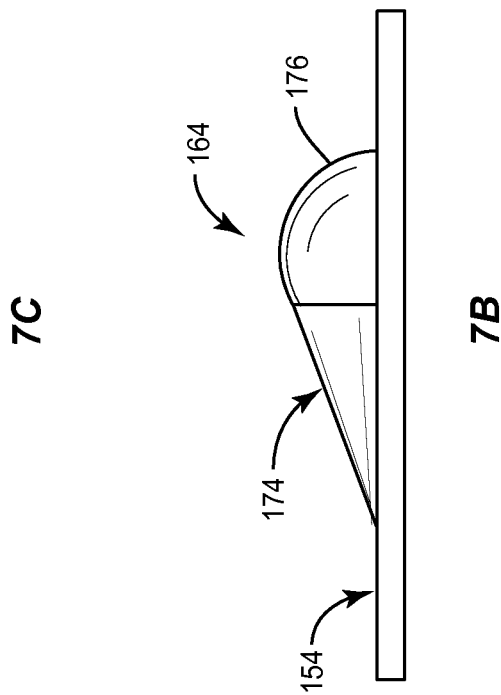

Referring to FIG. 7, an alternate embodiment of the mold flow modifier 146 configured as a solid hump 164 is depicted. In this embodiment, the solid hump 164 includes a cone-shaped portion 174 extending away from the surface 154. The solid hump 164 additionally includes a spherical portion 176 extending away from the surface 154. The spherical portion 176 adjoins the cone-shaped portion 174. The rate of incline of the cone-shaped portion 174 and the curvature of the spherical portion 176 may be adjusted to retard the flow of liquefied molding material by a desired amount.

Figure 8:
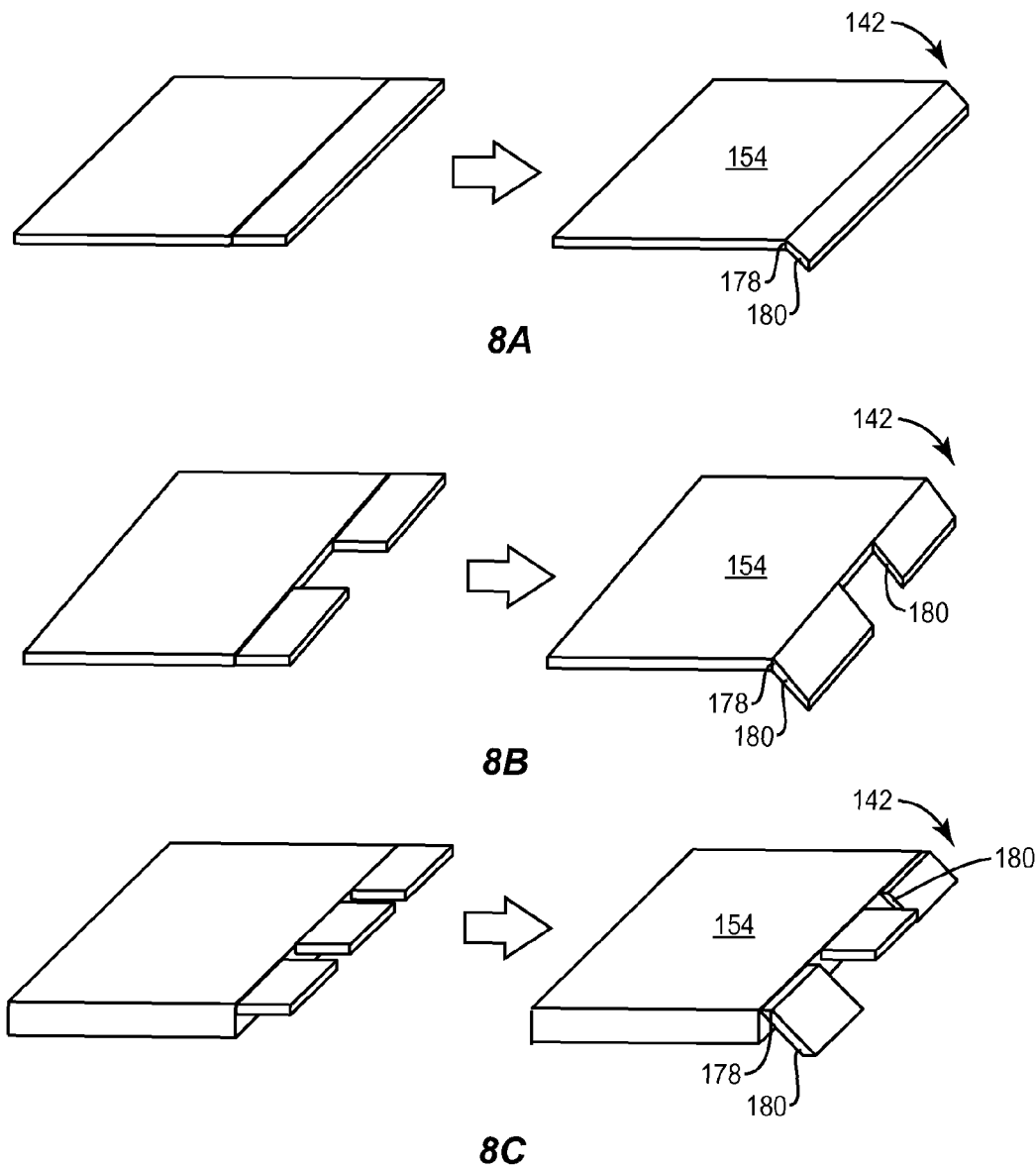
FIG. 8 including

In the embodiment of FIG. 8, the mold flow modifier 146 is formed by a bend 178 in the lead frame 116. As a result, the mold flow modifier 146 is configured with a planar surface 180 arranged at the end 142 of the lead frame 116. When arranged in the mold housing 102, the end 142 may be opposite to the gate 114. As a result, the mold flow modifier 146 is arranged as the last portion of the lead frame 116 that liquefied molding material 136 reaches when flowing through the interior cavity 104. According to this embodiment, the planar surface 180 extends away from the lead frame so as to retard the flow of liquefied molding material 136 in one of the first and second cavity sections 122, 124. The planar surface 180 prohibits the liquefied molding material 136 from flowing around the end 142 of the lead frame 116 and interfering with filling of liquefied molding material 136 in an opposite one of the first and second cavity sections 122, 124.

If a topology 134 of the lead frame 116 is such that the first rate 148 is less than the second rate 150, the planar surface 180 may extend away from the rear surface 120 towards the bottom side 108 of the cavity 104 so as to retard the flow of liquefied molding material 136 in the second cavity section 124. That is, the planar surface 180 of the mold flow modifier 146 is inclined with respect to the rear surface 120 and thus provides a counteracting force that resists the flow of liquefied molding material 136. The angle of incline of the planar surface 136 with respect to the surface 154 and the length of the planar surface 136 may be adjusted to provide a desired compensation. Further, the number and configuration of the planar surfaces may vary. As shown in FIG. 8A, a single planar surface 180 spans across the entire end 142 of the lead frame 116. Alternatively, as shown in FIG. 8B, a plurality of discrete planar surfaces 180 may be arranged at the end 142 of the lead frame such that there is a gap between the discrete planar surfaces 180. Each of these planar surfaces may be angled identically with respect to the rear surface 120 or the top surface 118, or may be arranged at different angles, as is depicted in FIG. 8C.

The bend 178 in the lead frame 116 that forms the mold flow modifier 146 may be rigid so that the mold flow modifier 146 does not substantially flex under pressure exerted by liquefied molding material 136 flowing in the interior cavity 104. Alternatively, the bend 178 in the lead frame 116 that forms the mold flow modifier 146 may be flexible. As a result, the mold flow modifier 146 is configured to provide variable resistance to liquefied molding material 136 that enters one of the first and second cavity sections 122, 124 and contacts the planar surface 180 by bending. For example, if the planar surface 180 extends away from the rear surface 120 towards the bottom side 108, the mold flow modifier 146 is configured to flex towards the top side 106 of the cavity 104 upon pressure exerted by the flow of liquefied molding material 136. The extent to which the mold flow modifier 146 flexes depends upon the flow pressure applied by the liquefied molding material 136, which is dependent on the molding process. The mold flow modifier 146 may be configured such that a portion of the lead frame 116 is thinner in the vicinity of the bend 178, thus creating a weaker point from which the mold flow modifier 146 pivots around to provide a variable resistance in the above described manner.

Advantageously, the mold flow modifier 146 in the above described embodiments may be formed by simple, cost effective manufacturing techniques. The mold flow modifier 146 may be formed with a single punch to the lead frame 116 that raises the material and optionally creates an opening 160. For instance, mold flow modifier 146 depicted in the embodiments of FIGS. 4-7 may be formed by a coining or stamping process. In the embodiment of FIG. 8, the mold flow modifier 146 may be formed by bending the lead frame 116 at the outer end 142.

The mold flow modifier 146 may be used in a method of packaging a semiconductor chip 126. The method includes arranging a lead frame 116 in an interior cavity 104 of a mold housing 102. The lead frame 116 includes a top surface 118, a rear surface 120 opposite the top surface 118 and a mold flow modifier 146. The interior cavity 104 includes a top side 106 spaced apart from a bottom side 108 and first and second end sides 110, 112 extending between the top and bottom sides 106, 108. The lead frame 116 is positioned in the interior cavity 104 to form a first cavity section 122 between the top surface 118 and the top side 106 and a second cavity section 124 between the rear surface 120 and the bottom side 108. That is, the lead frame 116 may be positioned relative to a mold housing 102 in a similar manner as depicted in FIG. 1.

According to an embodiment of the method, a semiconductor chip 126 is arranged on the top surface 118. Optionally, a plurality of semiconductor chips 126 may be arranged on the top surface 118. The semiconductor chips 126 may be mounted using any commonly known technique, such as solder, adhesive tape, epoxy, etc. The semiconductor chips 126 are electrically connected to the lead frame 116 with electrical conductors 128 arranged between conductive terminals of the semiconductor chip 126 and the top surface 118. The electrical conductors 128 may be wires or ribbons extending between conductive terminals 130 on top side 132 of the semiconductor chip 126 and the top surface 118. Alternatively, a flip chip technology may be utilized in which conductive terminals 130 arranged on a bottom side of the semiconductor chip 126 face and electrically connect to conductive pads on the top surface 118. According to an embodiment, two semiconductor chips 126 are mounted to the mounting surface 118, wherein each of the semiconductor chips 132 are electrically connected by bonding wires 128 of different thickness. That is, the method may include arranging semiconductor chips 126 and bonding wires 128 in a similar manner as depicted in FIG. 1. The thicker bonding wires 128 may be 350 microns wide, for example. The size, number and configuration of semiconductor chips 126 and electrical conductors 128 may vary, depending upon application requirements.

According to the method, liquefied molding material 136 is transferred or injected in a gate 114 in the mold housing 102. The gate 114 extends to the first end side 100 of the cavity 104. That is, the gate 114 is a perforation in the mold housing 102 dimensioned to receive a molding tool 138. The molding tool 138 may be a component of a well-known semiconductor package molding tool, for example. The liquefied molding material 136 may be injected into the gate 114 in a similar manner as depicted in FIGS. 2 and 3. A topology 134 of the lead frame 116 is such that the liquefied molding material 136 fills the first cavity section 122 at a first rate 148 and fills the second cavity 124 section at a second rate 150 that is different than the first rate. The difference between the first rate 148 and the second rate 150 may be attributable to the topology 134 on the lead frame 116 as well as the orientation of the lead frame 116, as previously discussed with reference to FIGS. 1-3.

According to an embodiment, the semiconductor chip 126 and bonding wires 128 retard the flow of liquefied molding material 136 across the top surface 118 such that the first rate 148 is less than the second rate 150. Thus, as shown in FIG. 3, liquefied molding material 136 flowing in the second cavity section 124 along the rear surface 120 advances faster and reaches the mold flow modifier 146 before liquefied molding material 136 flowing in the first cavity section 122 advances by a corresponding distance along the top surface 118 creating a flow lag at the top cavity compared with the bottom cavity.

The method further includes compensating for the difference between the first and second rates 148, 150 by using the mold flow modifier 146 to redirect the flow of liquefied molding material 136 across the top surface 118 or the rear surface 120. If the first rate 148 is less than the second rate 150, as is shown in FIG. 3, compensating for the difference between the first and second rates 148, 150 may be achieved by retarding the flow of liquefied molding material 136 in the second cavity section 124 with the mold flow modifier 146. The mold flow modifier 146 used to compensate for the difference between the first and second rates 148, 150 may be any one of the mold flow modifier embodiments discussed with reference to FIGS. 4-8.

According to an embodiment, compensating for the difference between the first and second rates 148, 150 includes using the mold flow modifier 146 to guide liquefied molding material 136 from the second cavity section 124 to the first cavity section 122 through an opening 160 in the lead frame 116. This may achieved by using the mold flow modifiers disclosed with reference to FIGS. 4-5, which include an include chute 152 and an opening 160 in the lead frame. Advantageously, the possibility of voiding is reduced or eliminated.

According to an embodiment, the mold flow modifier 146 compensates for the difference between the first rate 148 and the second rate 150 by exclusively influencing the flow of liquefied molding material 136 in the second cavity section 124. That is, the mold flow modifier 146 does not contribute to an increase to the first rate 148. In this embodiment, the mold flow modifier 146 may be a solid hump 164 as discussed with reference to FIGS. 6-7. The solid hump 164 is used to retard the liquefied molding material 136 flowing across the rear surface 120 in a manner previously discussed. As a result, the liquefied molding material 136 does not completely fill the second cavity 124 section substantially before filling the first cavity section 122, and the possibility of voiding is reduced or eliminated.

The methods described herein may include combining any of the mold flow modifiers discussed herein. For instance, the embodiments of FIGS. 4, 5, 6 and 7 may be integrated into a single lead frame 116 so that the combined effects of these mold flow modifiers 146 may be used to compensate for the difference between the first rate 148 and the second rate 150. Further, the methods described herein may include compensating for a second rate 150 that is less than the first rate 148 by arranging the mold flow modifier 146 on the top surface 118. That is, liquefied molding material 136 may flow faster across the semiconductor top surface 118 than the rear surface 120 and the mold flow modifier 146 may be arranged on the top surface 118 to compensate for this effect.

The liquefied molding material 136 used in the methods disclosed herein may be any molding material commonly utilized for the encapsulation of a semiconductor chip. According to another embodiment, the liquefied molding material 136 is a thermosetting polymer. The thermosetting polymer in pellet form is heated or chemically reacted and crushed physically to be in a liquefied state and injected into the interior cavity 104. Subsequently, the thermosetting polymer under mold heat chemically reacts so as to form an irreversibly hardened structure. The embodiments described herein may include a transfer molding process and may include injection molding. In an injection molding process, the liquefied molding material 136 may be a thermosetting polymer, for example.

FIG. 9 depicts a semiconductor package assembly 200 that may be formed according to the methods discussed herein that includes the mold flow modifier 146 as discussed herein. The semiconductor package assembly 200 includes a lead frame 116 comprising a top surface 118 and a rear surface 120 opposite the top surface 118. A semiconductor chip 126 is mounted on the top surface 118. The semiconductor chip 126 may be a power IGBT switching device, a sensor device, or a custom or multipurpose integrated circuit, for example. Optionally, two or more semiconductor chips 126 may be arranged on the top surface 118. Electrical conductors 128 are arranged between conductive terminals 130 of the semiconductor chip 126 and the top surface 118. The electrical conductors 128 may be bonding wires or ribbons, for example. A solidified molding material 182 adjoins the lead frame 116 and semiconductor chip 126 so as to encapsulate the semiconductor chip 126 and electrical conductors 128. The solidified molding material 182 may be a thermoplastic or a thermoset polymer, for example.

The semiconductor package assembly of FIG. 9 includes a mold flow modifier 146 arranged on the lead frame 116. The mold flow modifier 146 extends away from the lead frame 116. The mold flow modifier 146 is configured to compensate for a difference between a first rate 148 of liquefied molding material 136 flowing across the top surface 118 and a second rate 150 of liquefied molding material flowing across the rear surface 120 in a manner previously discussed. The liquefied molding material 136 solidifies into the solidified molding material 182.

Figure 9A:
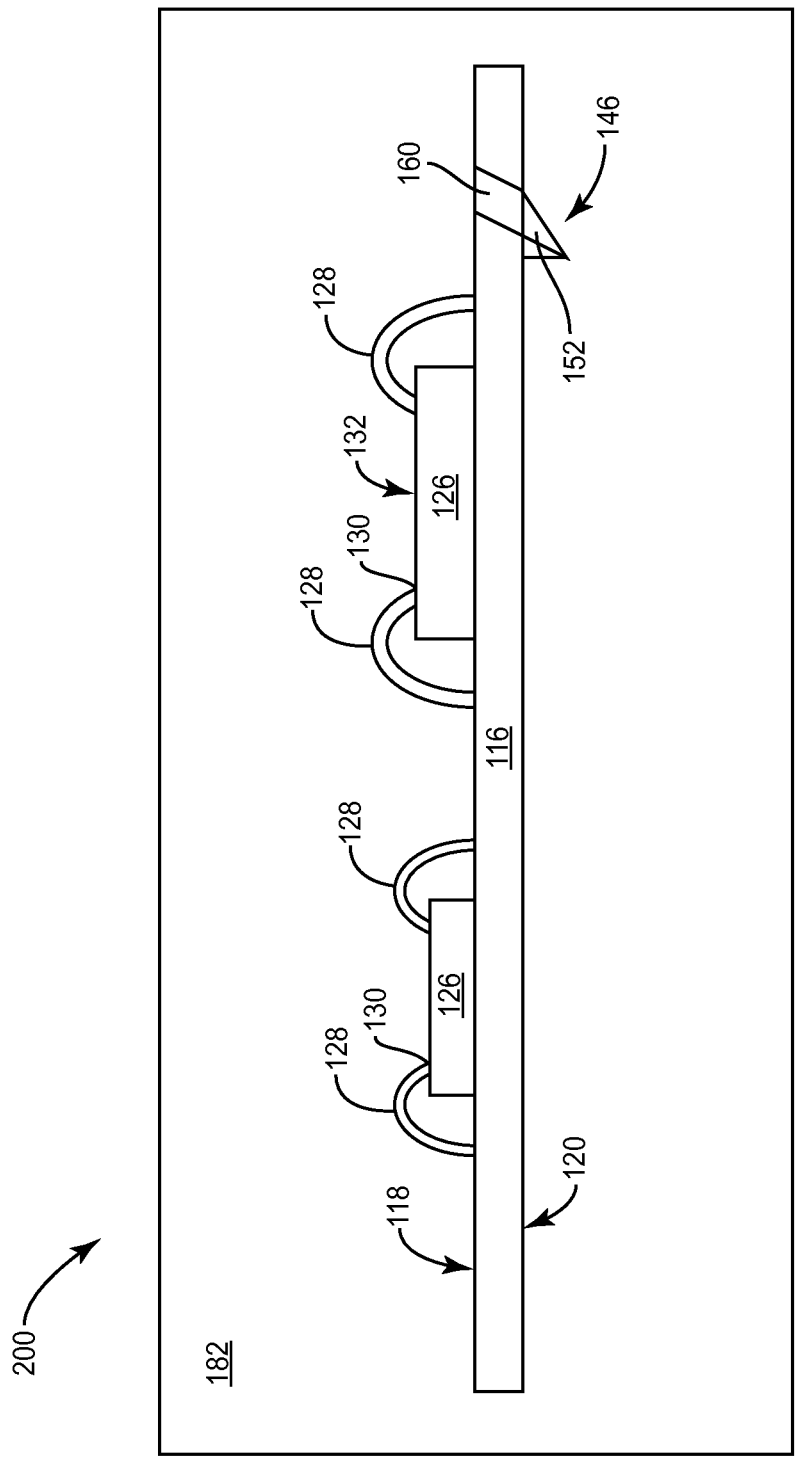
FIGS. 9A-9C depicts a semiconductor package assembly that includes a mold flow modifier arranged on a lead frame, according to an embodiment.
Figure 9B:
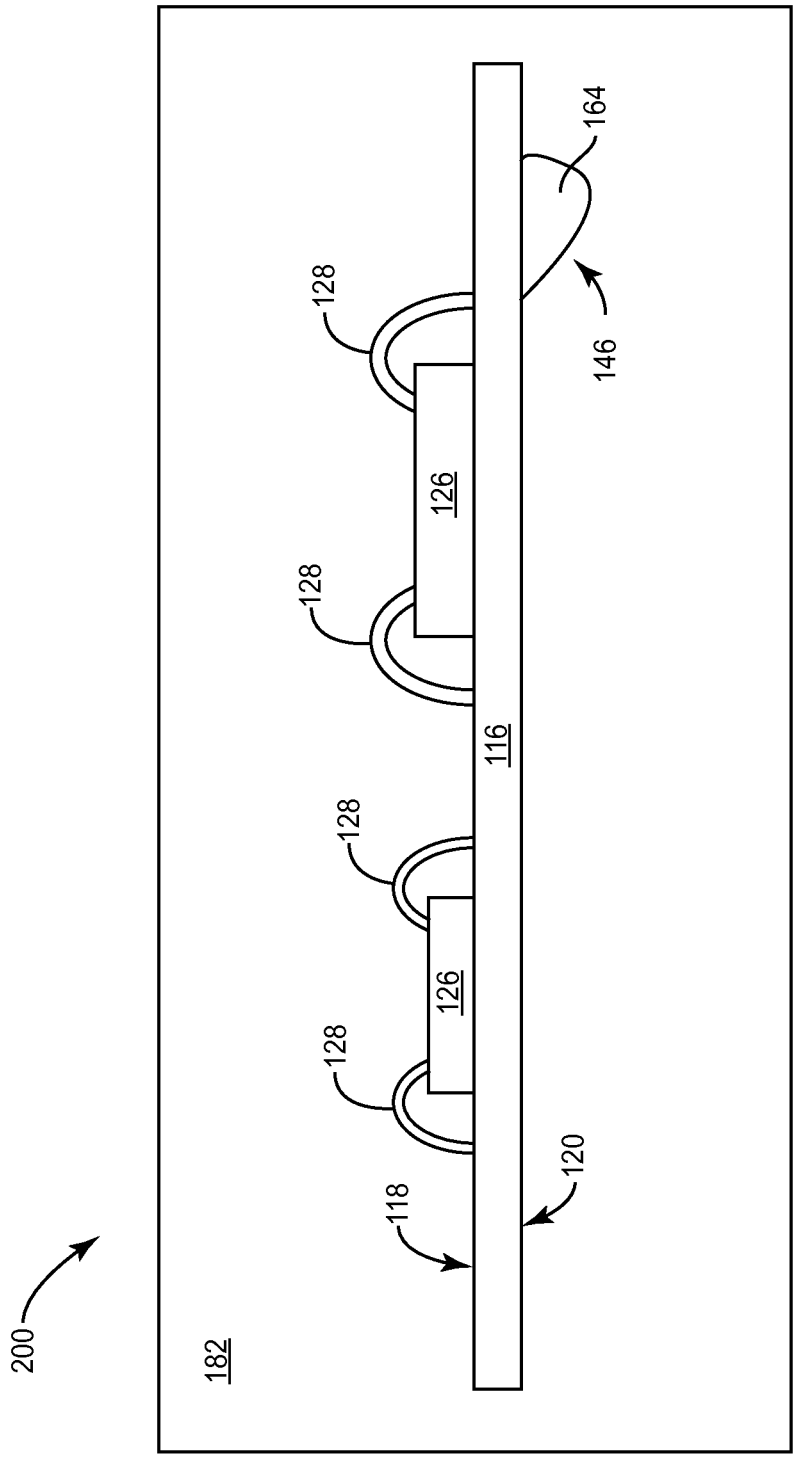
Figure 9C:
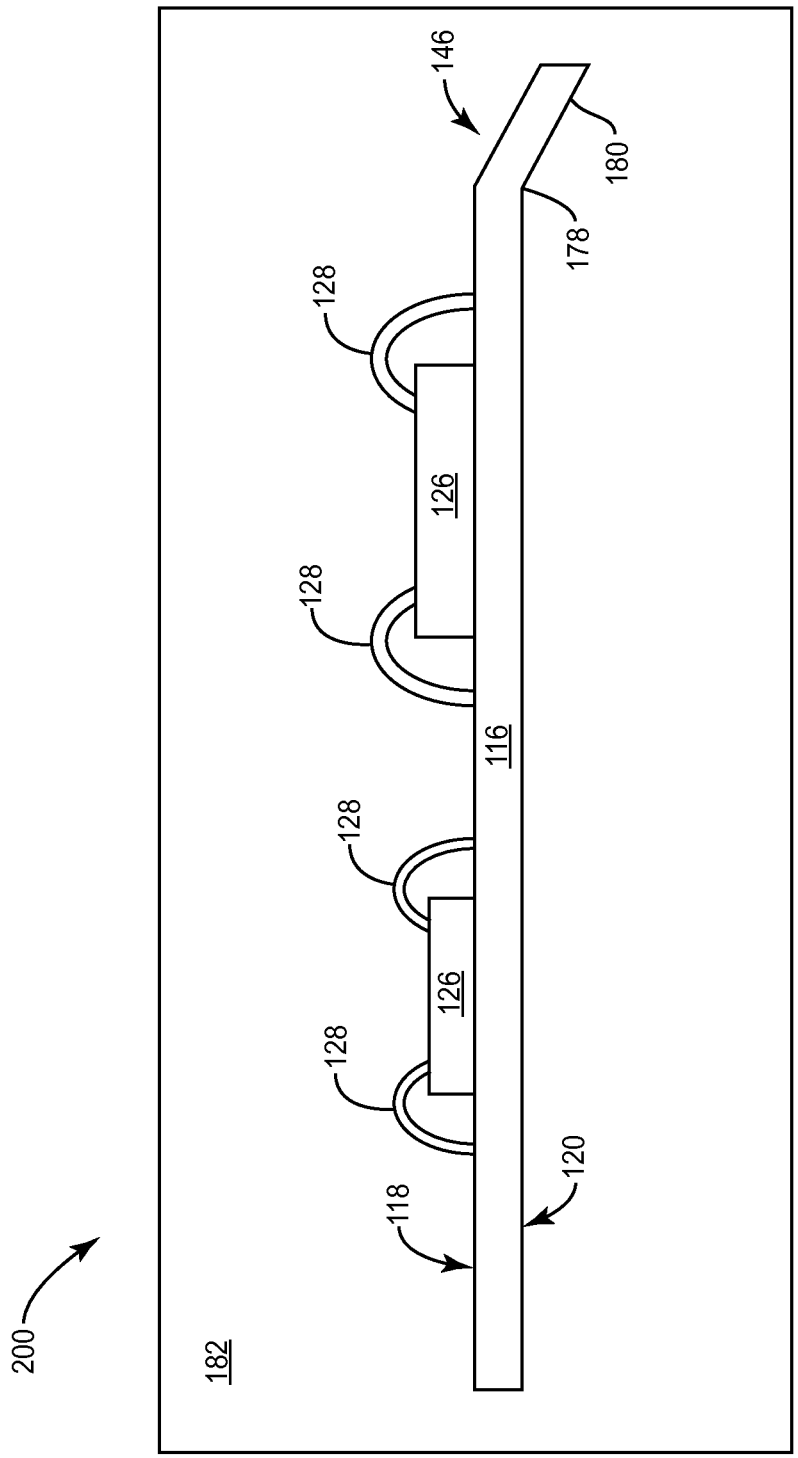

The mold flow modifier 146 may be configured according to any of the embodiments depicted in FIGS. 4-8 and previously discussed. As shown in FIG. 9A, the mold flow modifier 146 includes an inclined chute 152 extending away from the rear surface 120. The inclined chute 152 is configured to guide liquefied molding material 136 flowing across the rear surface 120 through an opening 160 in the lead frame 116 to the top surface 118. The inclined chute 152 may be configured according to the embodiments of FIGS. 4 and 5. As shown in FIG. 9B, the mold flow modifier is configured as a solid hump 164 arranged on the rear surface 120. The solid hump 164 is configured to reduce the second rate 150 by retarding the liquefied molding material 136 flowing across the rear surface 120 away from the lead frame 116. The solid hump 164 may be configured according to the embodiments of FIGS. 5 and 6. As shown in FIG. 9C, the mold flow modifier 146 includes a planar surface 180 arranged at an end 142 of the lead frame. The planar surface 180 extends away from the rear surface 120 at an incline. The planar surface 180 may arise from a bend 178 in the lead frame, as described in the embodiment of FIG. 8.

As used herein, the term "inclined, "arranged at an incline," and the like refers to an orientation of two substantially planar surfaces. These surfaces are oriented such that the surfaces are non-parallel to one another. That is, the planes created by both surfaces (if extended into one another) intersect at some point at an angle.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

The term "substantially" encompasses relationships or physical features of the elements that are both exactly in conformity with the requirement as well as minor deviations from the requirements due to manufacturing process variations, assembly, and other factors that may cause a deviation from the ideal.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor package formation arrangement, the arrangement comprising:
   a mold housing comprising an interior cavity, the cavity comprising a top side spaced apart from a bottom side and first and second end sides extending between the top and bottom sides,
   a gate for transferring liquefied molding material into the cavity, the gate arranged in the mold housing and extending to the first end side of the cavity; and
   a lead frame comprising a top surface, a rear surface opposite the top surface and a mold flow modifier, the lead frame positioned in the interior cavity so as to form a first cavity section between the top surface and the top side and a second cavity section between the rear surface and the bottom side;
   a semiconductor chip mounted on the top surface; and
   electrical conductors arranged between conductive terminals of the semiconductor chip and the top surface,
   wherein a topology of the lead frame is such that that the liquefied molding material fills the first cavity section at a first rate and fills the second cavity section at a second rate that is different than the first rate, and
   wherein the mold flow modifier extends away from the lead frame so as to compensate for the difference between the first and second rates,
   wherein the semiconductor chip and electrical conductors retard the flow of liquified molding material across the top surface such that the first rate is less than the second rate, and
   wherein the mold flow modifier extends away from the rear side of the lead frame and is configured to compensate for the difference between the first and second rates by retarding the flow of liquefied molding material in the second cavity section.

2. The semiconductor package formation arrangement of claim 1, wherein the mold flow modifier is configured to compensate for the difference between the first and second rates by redirecting liquefied molding material from the second cavity section to the first cavity section.

3. The semiconductor package formation arrangement of claim 2, wherein the mold flow modifier comprises an inclined chute extending away from the rear surface, the inclined chute configured to guide liquefied molding material from the second cavity section to the first cavity section through an opening in the lead frame.

4. The semiconductor package formation arrangement of claim 3, wherein the inclined chute comprises two sidewall sections spaced apart from one another and a roof section extending between the two sidewall sections, the two sidewall portions and the roof section adjoining the lead frame adjacent the opening, the roof section arranged at an incline with respect to the rear surface.

5. The semiconductor package formation arrangement of claim 3, wherein the inclined chute comprises a semi-circular portion extending away from the rear surface and adjoining the opening in the lead frame.

6. The semiconductor package formation arrangement of claim 1, wherein the mold flow modifier comprises a solid hump arranged on the rear surface, and wherein the solid hump is configured to retard the flow of liquefied molding material in the second cavity section by redirecting liquefied molding material flowing across the rear surface towards the bottom side of the cavity.

7. The semiconductor package formation arrangement of claim 6, wherein the solid hump comprises two sidewalls and an outer surface, the two sidewalls extending away from the rear surface at a perpendicular angle, the outer surface comprising an inclined plane with respect to the rear surface and a curved section.

8. The semiconductor package formation arrangement of claim 7, wherein the solid hump comprises a cone-shaped portion extending away from the rear surface at an incline and a spherical portion adjoining the cone-shaped portion.

9. The semiconductor package formation arrangement of claim 1, wherein the mold flow modifier comprises a planar surface arranged at an outer end of the lead frame opposite the gate, the planar surface extending away from the rear surface towards the bottom side of the cavity.

10. The semiconductor package formation arrangement of claim 9, wherein the mold flow modifier is configured to provide variable resistance to liquefied molding material flowing in the second cavity section and contacting the planar surface by bending towards the top side of the cavity.

* * * * *